United States Patent [19]
Colwell et al.

[11] Patent Number: 5,644,251
[45] Date of Patent: Jul. 1, 1997

[54] SWITCHABLE PULL-UPS AND PULL-DOWNS FOR IDDQ TESTING OF INTEGRATED CIRCUITS

[75] Inventors: Michael Colwell, Livermore; Rochit Rajsuman, San Jose; Ray Abrishami, Los Altos; Zarir B. Sarkari, Santa Clara, all of Calif.

[73] Assignee: LSI Logic Corporation, Milpitas, Calif.

[21] Appl. No.: 533,688

[22] Filed: Sep. 26, 1995

Related U.S. Application Data

[63] Continuation-in-part of Ser. No. 359,950, Dec. 20, 1994, abandoned, which is a continuation of Ser. No. 52,418, Apr. 22, 1993, abandoned.

[51] Int. Cl.⁶ ................................................. H03K 19/00
[52] U.S. Cl. ........................... 326/16; 326/39; 371/22.1
[58] Field of Search ................................. 326/16, 39, 83; 371/22.1, 22.2, 22.3, 22.6

[56] References Cited

U.S. PATENT DOCUMENTS 5,371,457  12/1994  Lipp ........................................ 324/158
5,467,026  11/1995  Arnold ..................................... 326/16
5,475,330  12/1995  Watanabe et al. ....................... 326/16

*Primary Examiner*—Edward P. Westin
*Assistant Examiner*—Richard Roseen

[57] ABSTRACT

An integrated circuit includes a plurality of signal lines, a plurality of pull transistors connected between the signal lines respectively and an electrical potential, and an IDDQ test control for turning on the pull transistors for normal operation, and for turning off the pull transistors for IDDQ testing. The IDDQ test control includes a test signal generator for generating an IDDQ test control signal that turns off the pull transistors, and an IDDQ test signal line that is connected to the test signal generator and to the pull transistors. The pull transistors are designed within a periphery of the circuit, and the IDDQ test signal line forms a ring. The test signal generator includes an external pin, a special buffer, or a boundary scan system including a chain of boundary scan cells and a test access port controller. The test control signal can be generated by one of the boundary scan cells, or by the test access port controller.

33 Claims, 8 Drawing Sheets

SWITCHABLE PULL-UPS AND PULL-DOWNS FOR IDDQ TESTING OF INTEGRATED CIRCUITS

CROSS-REFERENCE TO RELATED APPLICATION

This application is a continuation-in-part of U.S. patent application Ser. No. 08/359,950, filed Dec. 20, 1994, now abandoned, which is a continuation of U.S. patent application Ser. No. 08/052,418, filed Apr. 22, 1993, now abandoned.

The continuation data is listed on the original declaration as filed in the application, and priority of the parent applications is claimed under 35 USC 120.

BACKGROUND OF THE INVENTION

1. Field of the Invention

The present invention relates to semiconductor integrated circuits and techniques for detecting physical defects and faults therein. More particularly, the present invention relates to switchable pull-up and pull-down circuits which permit accurate IDDQ defect and fault detection measurement of integrated circuits having signal lines with pull-ups and/or pull-downs and any other static current dissipating logic.

2. Description of the Related Art

Integrated circuits typically incorporate a very high density of circuit components, most of which are susceptible to a variety of different faults and physical defects. Many of the internal faults which arise during integrated circuit manufacture can be detected using various available test techniques. Testing should provide a desired level of fault and defect coverage defined in terms of a percentage of faults which are detectable in a given circuit using a particular test technique. In many integrated circuits, a fault coverage of 90% or higher is required.

One technique commonly used to detect Complementary Metal Oxide Semiconductor (CMOS) integrated circuit faults is a technique known in the art as IDDQ testing. IDDQ testing involves a precision measurement of quiescent $V_{DD}$ supply current under various combinations of input logic states. These combinations are known as test vectors.

IDDQ testing is based upon the fact that absent any internal faults, the quiescent $V_{DD}$ supply current in a typical CMOS integrated circuit should be on the order of less than 100 nanoamps. A physical defect such as bridging will produce a measurable increase in quiescent supply current in response to a particular test vector. IDDQ testing thus provides substantial benefits in terms of defect detection. A high level of defect coverage can be obtained with a reduced set of test vectors and minimal test time provided that the test vectors produce a high toggle coverage of internal logic nodes.

IDDQ testing permits a clear determination of the source of many common defects. In addition, IDDQ testing can be performed on circuits which cannot be adequately tested using other available techniques. Further detail regarding the benefits of IDDQ testing can be found in R. Fritzemeier et al., "Increased CMOS IC Stuck-at Fault Coverage with Reduced IDDQ Test Sets", International Test Conference, Sep. 10–12, 1990.

IDDQ testing was not practical for integrated circuits having signal lines with pull-ups or pull-down transistors/resistors with I/Os. A voltage pull-up is fairly common among integrated circuit input and output signal lines. Voltage pull-ups provide a number of advantages such as interface compatibility, improved noise immunity and a uniform predictable transition between voltage rails. It is therefore often desirable to maintain voltage pull-ups on many integrated circuit input and output signal lines.

An exemplary prior art integrated circuit input is shown in FIG. 1. The integrated circuit input 10 includes a signal line 12 which is connected through a pull-up mechanism 11 to a voltage source 16. An input signal applied to pad 13 is supplied to buffer 19 via signal line 12. From buffer 19 the input signal can then be applied to other parts of the integrated circuit.

Prior art integrated circuit pull-up mechanism 11 typically consists of a PMOS FET 14 with its gate connected to ground potential 18 as shown. FET 14 occupies minimal space and is therefore a preferred pull-up mechanism in size-constrained integrated circuit applications. Similar pull-up mechanisms are presently used on other integrated circuit signal lines. In circuits not subject to stringent size constraints, pull-up mechanism 11 will typically consist of a pull-up resistor. Similarly, a pull-down mechanism can be used based on NMOS.

When an IDDQ test is performed on exemplary integrated circuit input I/O, the quiescent current measurement may be masked as a result of the current flowing through pull-up mechanism 11. Since IDDQ testing depends upon the measurement of quiescent current levels on the order of about 100 microamps or less, a single voltage pull-up can interfere with the measurement.

A voltage pull-up such as that shown in FIG. 1 will generally produce a few microamps of current when a low level signal is applied to signal line 12, approximately the same amount of current increase that the IDDQ test must be able to measure on the entire integrated circuit to accurately detect certain faults and physical defects. The current masking problem is compounded in the case of Application Specific Integrated Circuits (ASICs) which may include hundreds of signal lines with pull-ups or pull-downs.

IDDQ testing can therefore not be performed accurately on integrated circuits such as ASICs which contain significant numbers of pull-ups. As a result, designers must either avoid IDDQ testing or avoid using pull-ups or pull-downs in the circuit.

Alternatives to IDDQ fault detection testing present additional problems in many applications. A popularly used technique known as logic response stuck-at fault (SAF) testing involves applying stimuli to the inputs of a particular circuit, and examining the circuit outputs to determine if a particular internal fault exists.

However, it is difficult and costly to generate a sufficient number of input signal test vectors to detect a desired level of internal faults. In circuits with inherently low controllability, a large number of internal faults may be undetectable at the output regardless of the particular stimuli applied to the inputs. Circuits of this type include random logic control circuits and asynchronous designs. A desired fault coverage therefore may not be obtained for these circuits.

Secondly, any physical defects such as bridging, gate oxide shorts, and spot defects do not map into SAF. These defects cause indeterminate logic levels at the defect site, and thus these defects cannot be detected by any logic testing method.

An alternative to functional testing involves the use of a technique known as scan design. In this technique, additional test structures are incorporated into the integrated circuit in order to facilitate testing. Software programs generate test inputs which utilize these test structures to assist in fault detection.

One example of scan design implementation is disclosed in U.S. Pat. No. 5,032,783, issued to Hwang et al. However, the added scan structures consume scarce circuit space and power, and depending upon their placement in the circuit may introduce timing problems. As a result, an integrated circuit typically must be designed from the outset to incorporate acceptable scan structures. Scan structures cannot be easily incorporated into an existing integrated circuit design. Also, stuck-at faults, and physical defects such as bridging, gate oxide defects, and spot defects, cannot be detected by scan testing.

IDDQ testing overcomes many of the difficulties of the above alternative techniques in that it can provide a relatively high fault and defect coverage of greater than 90% without an excessively large set of test vectors or requiring that additional test structures be designed into the circuit itself. However, as previously mentioned, IDDQ test techniques are not readily compatible with pull-ups, pull-downs or any other static current dissipating logic such as phase-locked loops (PLL), memory sense amplifiers, differential logic, etc.

It is therefore not possible under current practice to obtain the full benefits of accurate IDDQ testing in integrated circuits incorporating pull-ups, or other static current dissipating logic such as PLL, memory sense amplifiers, differential logic, etc. Total IDDQ current is typically minimized under presently available techniques by setting signal lines with pull-ups to a high logic level and pull-downs to a low logic level. See R. Perry, "IDDQ Testing in CMOS Digital ASICS", 1992 IEEE International Test Conference, at p. 156. Signal lines with pull-ups and pull-downs are thus classified as "don't care faults" and effectively removed from the test vector set. See R. Fritzemeier et al., at p. 4. The result is reduced IDDQ test accuracy and lower fault and defect coverage.

As is apparent from the above, there presently is a dire need for an apparatus or method capable of providing accurate IDDQ testing while simultaneously maintaining the substantial benefits associated with integrated circuit pull-ups and pull-downs. A need currently exists for a technique capable of interfacing with IDDQ test equipment such that fault coverage is improved, while not interfering with functional operation of the integrated circuit. Further, a need exists for a simple and inexpensive method and apparatus that requires only relatively minor modification of the integrated circuit pull-up and pull-down mechanism.

SUMMARY OF THE INVENTION

The present invention provides a switchable pull-up circuit (the terms "pull" and "pull-up" will be used generically to further include pull-down and a combination pull-up and pull-down circuits) particularly well-suited for use in integrated circuit IDDQ testing. In accordance with one aspect of the invention, a novel switchable pull-up circuit is provided for use in an integrated circuit or other electronic device.

The pull-up circuit includes at least one control signal input and switching means connected between a signal line and a voltage potential. The switching means is responsive to a control signal applied to the control signal input such that the pull-up circuit can connect or disconnect the signal line from the voltage source as appropriate in a given application. The integrated circuit can additionally or alternatively include signal lines with pull-down circuits.

In accordance with another aspect of the invention the pull-up circuit is used in IDDQ testing of an integrated circuit having at least one signal line. IDDQ test signals are applied to the integrated circuit signal lines in order to determine if the devices within the integrated circuit are faulty. When an IDDQ test signal is applied to a particular signal line, an appropriate control signal is applied to the switching means associated with that signal line so that the signal line is no longer connected to the pull-up voltage source.

The IDDQ test can therefore be performed using the signal line since the pull-up is effectively disconnected from the signal line by the switching means. When IDDQ testing is complete, an appropriate control signal is applied to the switching means to effectively reconnect the signal line with the pull-up voltage source. Therefore, under normal functional operation the pull-up remains in place.

More specifically, an integrated circuit includes a plurality of signal lines, a plurality of pull transistors connected between the signal lines respectively and an electrical potential, and an IDDQ test control for turning on the pull transistors for normal operation, and for turning off the pull transistors for IDDQ testing.

The IDDQ test control includes a test signal generator for generating an IDDQ test control signal that turns off the pull transistors, and an IDDQ test signal line that is connected to the test signal generator and to the pull transistors. The pull transistors are spaced from each other within a periphery of the circuit, and the IDDQ test signal line forms a ring.

The test signal generator includes a boundary scan system including a chain of boundary scan cells and a test access port controller. The test control signal can be generated by one of the boundary scan cells, or by the test access port controller.

The present invention simultaneously provides the benefits of signal line pull-ups and accurate IDDQ testing of an integrated circuit containing pull-ups. The switching means of the switchable pull-up circuit of the present invention is operative to disconnect the pull-up voltage source during IDDQ testing while leaving the pull-up voltage source connected during normal circuit operation.

As a result, the present invention makes it possible to perform IDDQ tests on ASIC designs which include large numbers of pull-ups and pull-downs with I/Os. The present invention also provides a high level of fault coverage in circuits having inherently low controllability, such as random logic control functions or asynchronous designs, which are not adequately tested using other available techniques.

As another feature of the present invention, the switchable pull-up circuit is simple and inexpensive to implement. In the case of typical integrated circuits, existing pull-up mechanisms can be modified to serve as a switching means to selectively connect or disconnect the pull-up voltage source from signal lines during an IDDQ test as appropriate.

As an additional feature of the present invention, the switchable pull-up circuit can be used on many different types of signal lines, such as inputs, outputs and bidirectional signal lines. Furthermore, the switchable pull-up is readily compatible with a number of different IDDQ test setups. The control signal inputs from multiple switchable pull-up circuits according to the present invention can be multiplexed or otherwise combined to further increase IDDQ testing efficiency without adding excessive additional test circuitry to the integrated circuit.

As a further feature of the present invention, the switchable pull-up circuit can be used in other applications in which it is desirable to disconnect a pull-up from a particular signal line, such as conserving power on unused signal lines. The switchable pull-ups can thus enhance the versatility of a given circuit without significantly increasing the required power, space or manufacturing cost.

The above-discussed features and attendant advantages of the present invention will become better understood by reference to the following detailed description of the preferred embodiments and the accompanying drawings.

DETAILED DESCRIPTION OF THE INVENTION

The present invention provides a switchable pull-up circuit particularly well-suited for use in IDDQ testing of integrated circuits having input and output signal lines with pull-ups. It has been determined that significant improvements in IDDQ testing fault coverage are obtained by incorporating controllable switching capability into pull-ups and pull-downs.

Although the following detailed description is directed to the use of a switchable pull-up circuit in an integrated circuit having one or more signal lines pulled up to a common drain voltage source through a pull-up mechanism comprising a FET, it will be apparent that man, alternative implementations are also possible. For example, the general principles of the present invention could also be applied to integrated circuit signal lines which are pulled down to ground or a negative voltage potential (pull-down).

It should therefore be understood that the terms "pull" and "pull-up" as used generically herein are intended to include any device which is used to connect a signal line to a positive, negative or ground voltage potential. These terms as used herein thus encompass devices often otherwise referred to as pull-downs. Furthermore, the utility of the present invention is not limited to IDDQ testing but is instead applicable to any situation in which it is desirable to control connection of a signal line to a voltage potential. The term "pull circuit" can be used to generically denote a pull-up circuit or a pull-down circuit.

Figure 1:
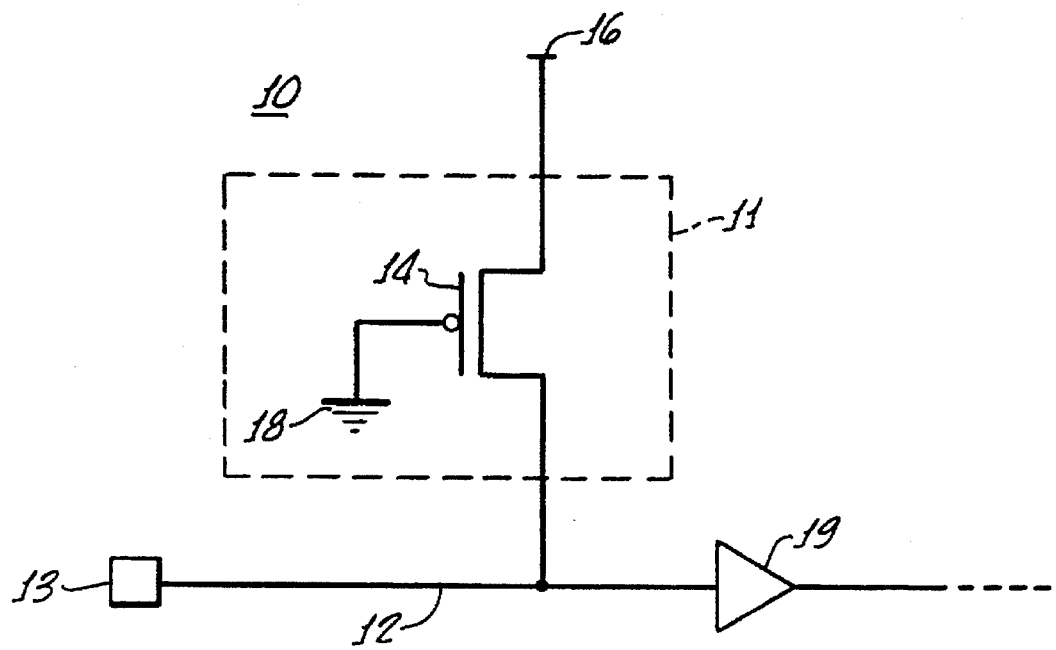
FIG. 1 shows an exemplary integrated circuit input having a pull-up mechanism in accordance with the prior art.
Figure 2:
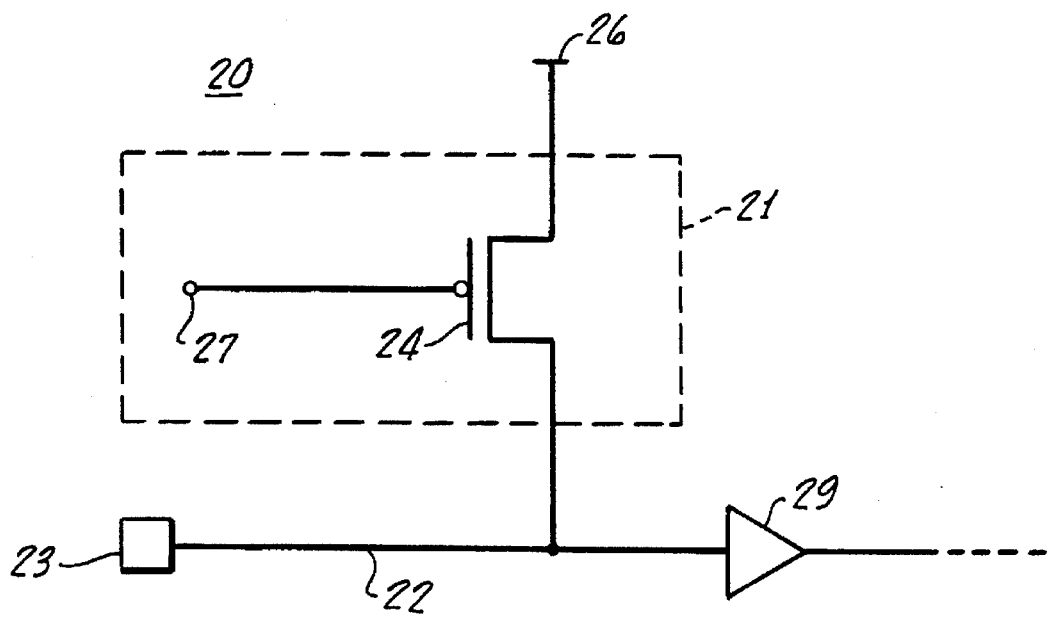
FIG. 2 shows the exemplary integrated circuit input portion of FIG. 1 incorporating a preferred embodiment of the switchable pull-up circuit of the present invention.

Alternative applications include reducing stand-by current on unused signal lines which include a pull-up, and providing a controllable interface to external circuitry. An exemplary embodiment of the switchable pull-up circuit of the present invention applied to an integrated circuit input is shown in FIG. 2. The exemplary integrated circuit input 20 includes a signal line 22 connected through a switchable pull-up circuit 21 to a voltage source 26.

In this exemplary embodiment voltage source 26 is preferably the $V_{DD}$ voltage source of the CMOS integrated circuit. The switchable pull-up circuit 21 includes switching means 24 responsive to a control signal input 27. In this exemplary embodiment, the switching means includes a PMOS FET 24. The switching means of the present invention may include a modified version of a typical CMOS integrated circuit pull-up mechanism. The means of switching is obtained by the signal line included in the I/O cell architecture.

Since a device having inherent switching capabilities is usually used in place of a pull-up resistor in integrated circuit applications due to size constraints, only a modification of the gate connection is required to convert it to a reliable switching means. The gate of PMOS FET 24, grounded when the device is serving only as a pull-up, provides a convenient control signal input. It should be understood that alternative switching means could also be used as appropriate to a given application, including, but not limited to NMOS FETs and GaAs devices.

A control signal applied to control signal input 27 switches PMOS FET 24 as will be discussed in greater detail below. An input signal applied to pad 23 is supplied to buffer 29 via signal line 22. From buffer 29 the input signal can then be applied to other parts of the integrated circuit. It should be emphasized that the switchable pull-up circuit 21 could be placed on other integrated circuit signal lines, including output signal lines as well as internal signal lines.

The operation of the exemplary switchable pull-up circuit 21 of FIG. 2 is as follows. During IDDQ testing of the integrated circuit it is desirable to disconnect signal line 22 from voltage source 26 in order to eliminate the current through the pull-up and prevent masking of the IDDQ measurement. If the pull-up were not disconnected there would be considerable static current flow from voltage source 26 through PMOS FET 24 when a low signal level is applied to signal line 22.

An appropriate control signal is therefore applied to control signal input 27 to turn off PMOS FET 24 when IDDQ testing of the path associated with signal line 22 is to be performed. In the preferred embodiment of FIG. 2 a control signal consisting of a logic high voltage potential is appropriate to switch PMOS FET 24 off, thereby effectively disconnecting signal line 22 from pull-up voltage source 26.

As a result, an accurate IDDQ current measurement can be made, and a greater number of physical defects and faults detected. Absent the elimination of the current flow through the PMOS FET, the integrated circuit devices in the signal path associated with this particular signal line could not be accurately tested using IDDQ techniques.

After IDDQ testing of the integrated circuit signal path associated with signal line 22 is completed, the appropriate control signal can be applied to control input 27 to configure the switchable pull-up circuit such that signal line 22 is again effectively connected to voltage source 26. In the preferred embodiment of FIG. 2, a logic low control signal is applied to turn PMOS FET 24 on, effectively re-connecting signal line 22 with voltage source 26. The exemplary integrated circuit input 20 is then properly reconfigured for subsequent fully functional operation.

Figure 3:
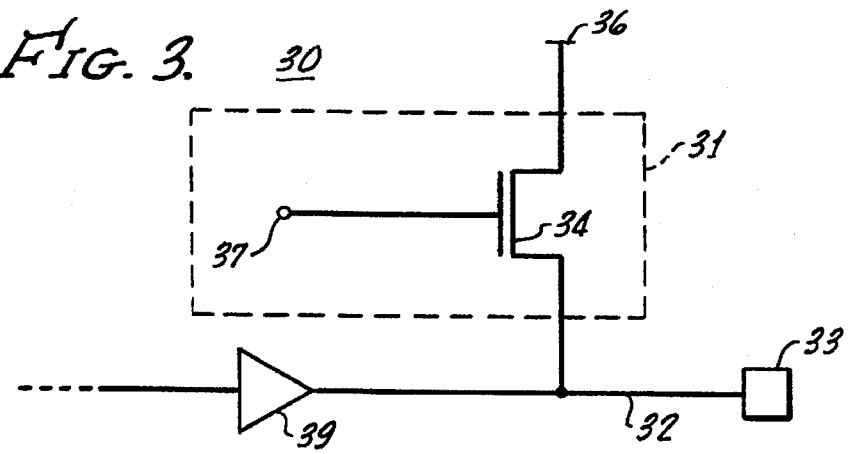
FIG. 3 shows an exemplary integrated circuit output incorporating a preferred embodiment of the switchable pull-up circuit of the present invention.

FIG. 3 illustrates a preferred embodiment of the switchable pull-up circuit of the present invention applied to an integrated circuit output. The exemplary output 30 includes a switchable pull-up circuit 31 connected to signal line 32 and output pad 33. The switchable pull-up circuit 31 includes a PMOS FET 34 connected between signal line 32 and a voltage source 36. Voltage source 36 is preferably the $V_{DD}$ voltage source of the CMOS integrated circuit. The gate of PMOS FET 34 is connected to control signal input 37.

The operation of this switchable pull-up circuit is similar to that described above in conjunction with the exemplary integrated circuit input. Under normal functional operation of the integrated circuit, a signal from the internal logic circuitry of the integrated circuit is applied to buffer 39. Control signal input 37 to PMOS FET 34 is connected to a logic low signal such that the output of buffer 39 and signal line 32 are effectively connected through PMOS FET 34 to voltage source 36.

During IDDQ testing of devices in the integrated circuit signal path associated with signal line 32, a logic high signal is applied to control signal input 37 to turn PMOS FET 34 off, thereby effectively disconnecting signal line 32 from voltage source 36. This eliminates the quiescent current drawn through the pull-up and improves the sensitivity of the IDDQ test.

Figure 4:
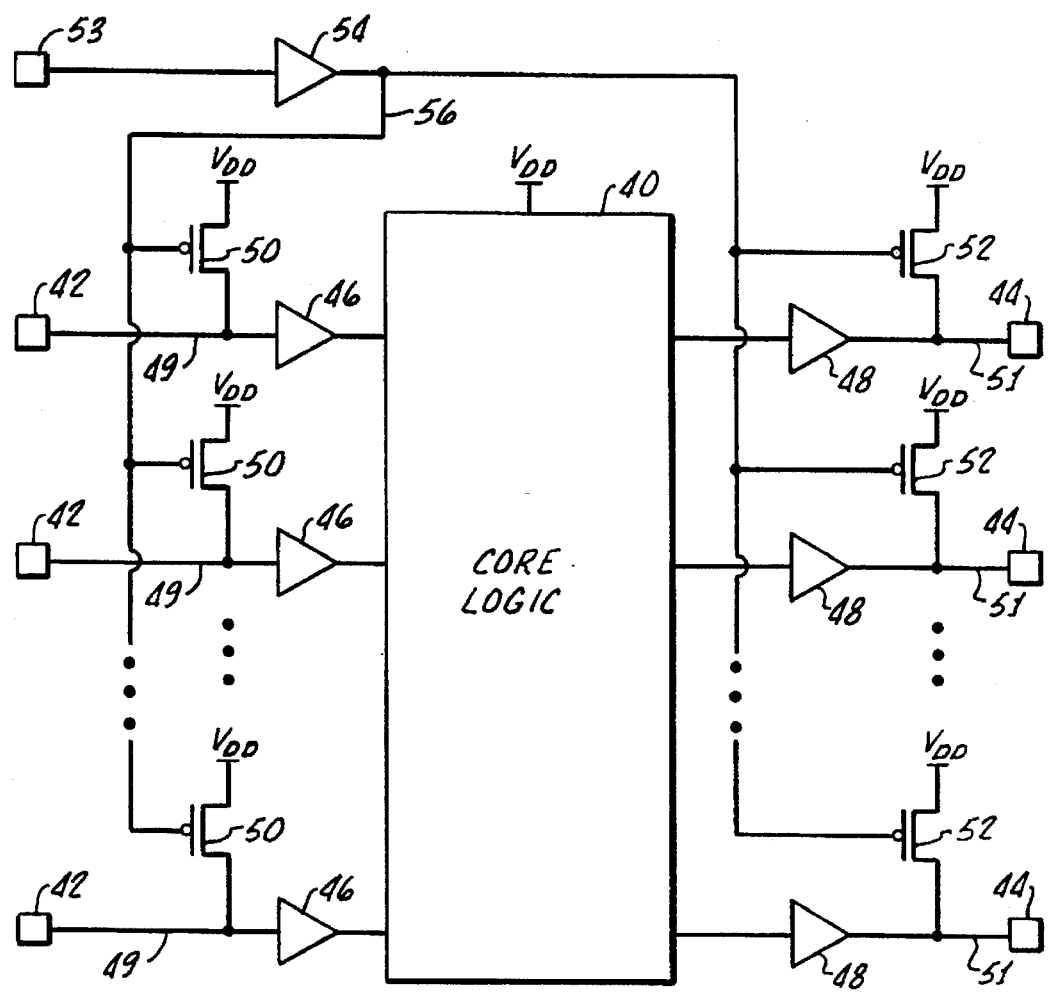
FIG. 4 is a schematic diagram illustrating an exemplary interconnection of multiple switchable pull-up circuits in an integrated circuit.

A typical integrated circuit includes many input and output signal lines. The switchable pull-ups of the present invention are preferably applied to all of the inputs and outputs of the integrated circuit which include pull-ups. FIG. 4 shows an exemplary integrated circuit having switchable pull-ups on multiple input and output signal lines.

The exemplary integrated circuit illustrated includes an internal core logic portion 40. The core logic 40 is externally accessed via a number of input pads 42 and output pads 44. Each input pad 42 is connected to the core logic 40 through a buffer 46. The core logic 40 is also connected to each output pad 44 through a buffer 48. Each input signal line 49 is pulled up to voltage source $V_{DD}$ via a pull-up circuit including a PMOS FET 50.

Each output signal line 51 is similarly pulled up to voltage source $V_{DD}$ via a pull-up circuit including a PMOS FET 52. In the exemplary embodiment of FIG. 4 the gates of all PMOS FETS 50, 52 are controlled by a single control signal input 53 through buffer 54.

During IDDQ testing a logic high signal is applied to control signal input 53 to turn off all PMOS FETs 50, 52 and thereby effectively disconnect the signal lines 49, 51 from voltage source $V_{DD}$. As a result, quiescent $V_{DD}$ supply current is significantly reduced. Each input with a pull-up, for example, will typically draw a few microamps of quiescent $V_{DD}$ current when a logic low is applied to that input.

An integrated circuit such as that shown in FIG. 4 might include more than one hundred of such inputs, resulting in a quiescent current draw on the order of tens to hundreds of microamps. A quiescent current in this range could easily mask physical defects such as bridging and cause a quiescent current draw of a few microamps.

To perform accurate IDDQ testing, the total quiescent $V_{DD}$ current draw of the integrated circuit must be smaller than the anticipated defect current by at least an order of magnitude. The present invention makes it possible to provide this type of IDDQ testing accuracy for circuits such as that shown in FIG. 4. When IDDQ testing is complete, normal functional operation of the integrated circuit can be quickly restored by applying a logic low signal to control signal input 53.

In the preferred embodiment of FIG. 4 all control lines for both the inputs and outputs were tied together to a single control signal input 53 which could be accessed externally. During IDDQ testing, an appropriate control signal applied to a single external pin of the integrated circuit could therefore be used to properly configure all of the switchable pull-up circuits.

In an alternative embodiment, control circuitry could be included within the integrated circuit to decode signals on existing input signal lines to determine when individual switchable pull-up circuits should be connected or disconnected. The control signal function could thus be provided using existing external pins and an internal decoder to detect a predetermined combination of input signals used to operate the switchable pull-ups.

In another alternative embodiment, additional external testability pins could be included, with each testability pin controlling a group consisting of one or more of the switchable pull-up circuits. The switchable pull-ups could be assigned to a testability pin based upon functionality, a desired IDDQ testing sequence, or some other suitable parameter.

As noted above, the present invention can be readily applied to alternative pull-up arrangements in which ground or negative voltage potentials are tied to the signal line. For example, in certain integrated circuits it may be desirable to connect input or output signal lines to a ground potential using an NMOS FET.

This arrangement is also known in the relevant art as a pull-down. Connecting the signal line to a ground potential through an NMOS FET creates problems for IDDQ testing accuracy in much the same manner as pull-ups to positive voltage potentials. When an output signal line is high the NMOS FET will cause a quiescent $V_{DD}$ current draw comparable to that produced on a signal line having a low signal level and a pull-up to a positive voltage potential.

It has been determined that IDDQ testing accuracy can be significantly improved in such a circuit by modifying the NMOS FET to include switching capability in accordance with the present invention. The control signal applied would be suitably modified in a manner well known in the art to permit switchable disconnection of the NMOS FET during IDDQ testing.

In an integrated circuit containing both PMOS FETs connecting signal lines to a positive voltage potential and NMOS FETs connecting signal lines to ground potential the same control signal could be used to switch both the PMOS and NMOS FETs by including an invertor in the control signal path to either the PMOS or NMOS devices as a group.

Figure 5:
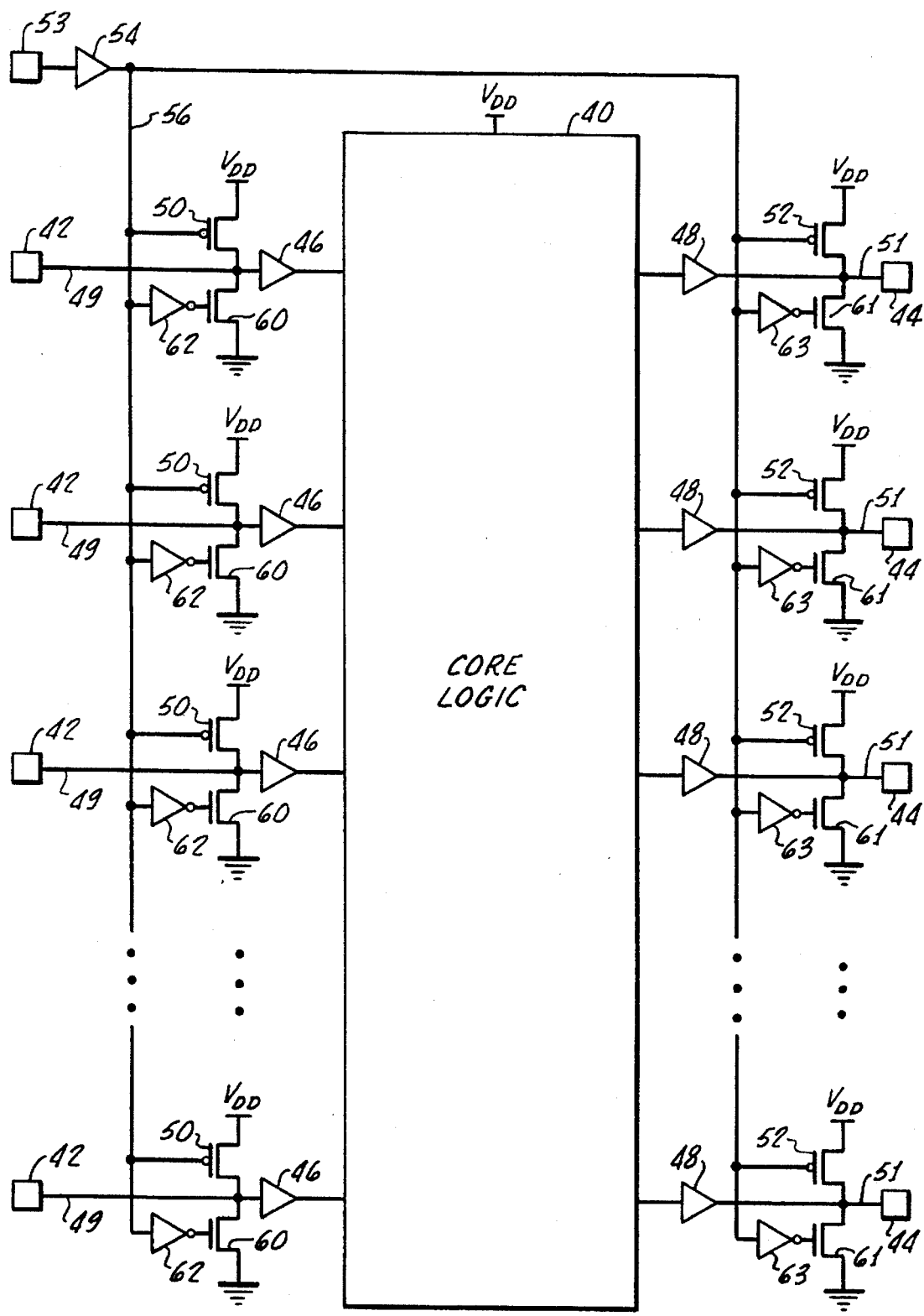
FIG. 5 is similar to FIG. 4, but additionally illustrates an exemplary interconnection of multiple switchable pull-down circuits.

An example of this arrangement is illustrated in FIG. 5, in which like elements are designated by the same reference numerals as in FIG. 4.

In addition to the pull-up transistors constituted by the PMOS FETs 50,52, pull-down transistors constituted by NMOS FETs 60 are connected between the signal lines 49 and a potential which is lower than $V_{DD}$, for example ground as illustrated, and pull-down transistors constituted by NMOS FETs 61 are connected between the signal lines 51 and ground.

The control signal is applied from the buffer 54 through inverters 62 to the gates of the FETs 60, and through inverters 63 to the gates of the FETs 61. The inverters 62,63 invert the logic value of the control signal so that opposite logic values are applied to the PMOS FETs and to the NMOS FETs.

When the control signal has a logic low value for normal operation, the PMOS FETs 50,52 are turned on as described above. The inverters 62,63 invert the logic low control signal to provide a high logic value which turns on the NMOS FETS 60,61.

For IDDQ testing, the control signal is logic high which turns off the PMOS FETs 50,52. The inverters 62,63 invert the logic high control signal to provide a logic low signal which turns off the NMOS FETs 60,61.

It is further within the scope of the invention to connect the inverters between the buffer 54 and the PMOS transistors 50,52 rather than between the buffer 54 and the NMOS transistors 60,61, and reverse the logic values of the control signal. In this case, normal operation would be produced with a logic high signal which turns on the pull-up and pull-down transistors, and a logic low signal which turns off the pull-up and pull-down transistors would be applied for IDDQ testing.

Figure 6:
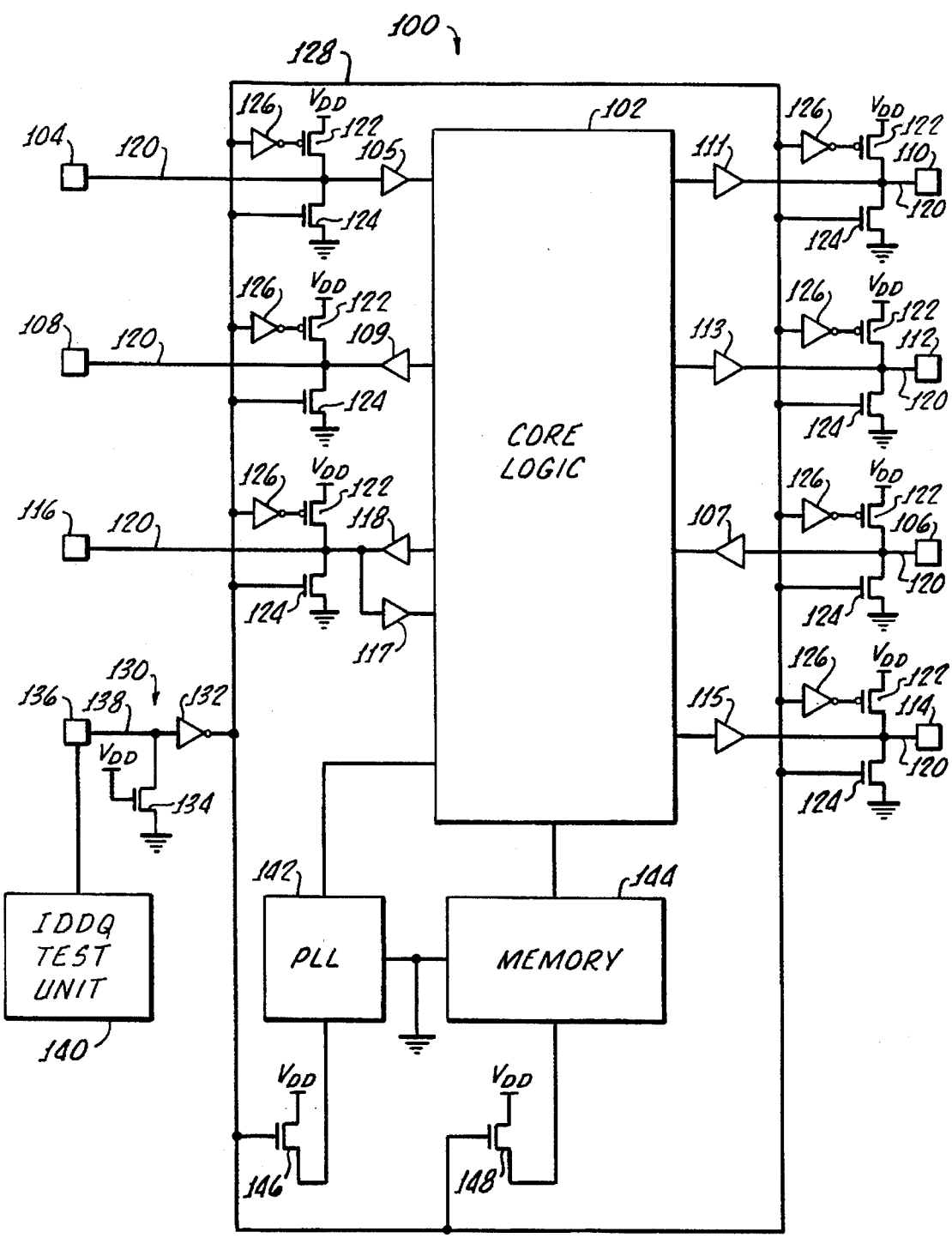
FIG. 6 is similar to FIG. 5, but illustrates control of a phase locked loop and a memory.

Another embodiment of the invention including switchable pull-ups and pull-downs is illustrated in FIG. 6. An integrated circuit chip 100 includes a core logic area 102, and a plurality of signal pads or ports which are spaced from each other inside and along the periphery of the chip 100. The ports can be used for signal input and/or output.

As shown, ports 104 and 106 are used for input and are connected to the core logic 102 through buffers 105 and 107 respectively. Ports 108, 110, 112 and 114 are used for output and are connected to the core logic 102 through buffers 109, 111, 113 and 115 respectively. A port 116 is used for input and output (bidirectional), and is connected to the core logic 102 through an input buffer 117 and a tri-state output buffer 118.

The ports are connected to the respective buffers through signal lines that are collectively designated as 120. Each signal line 120 is provided with a pull-up and a pull-down. More specifically, a PMOS pull-up transistor 122 is connected between each signal line 120 and the potential $V_{DD}$, and an NMOS pull-down transistor 124 is connected between each signal line 120 and ground.

The transistors 122 and 124 each include, although not explicitly illustrated, a source and drain which define a channel therebetween, and a gate which controls current flow through the channel. Current flows through the source, drain and channel between the signal line and $V_{DD}$ or ground, whereas the transistors 122 and 124 are turned on for normal operation and turned off for IDDQ testing by applying a control signal to the gates thereof.

In accordance with an important feature of the present invention, an IDDQ test signal line 128 forms a continuous ring which passes through the pull-up/pull-down circuitry inside the ports. The line 128 is connected directly to the gates of the pull-down transistors 124, and line is connected through invertors 126 to the gates of the pull-up transistors 124.

A high signal on the line 128 turns on all of the transistors 122 and 124 for normal circuit operation. A low signal on the line 128 turns off all of the transistors 122 and 124 for IDDQ testing. This logic is reversed from that as illustrated in FIG. 5. However, it is of course within the scope of the invention to adapt the integrated circuit 10 to operate with the logic of FIG. 5.

In the embodiment of FIG. 6, the potential on the line 128 is controlled by an IDDQ test signal generator 130 which includes an inverting buffer 132 and an NMOS pull-down transistor 134 which is connected between the input of the buffer 132 and ground. The gate of the transistor 134 is connected to $V_{DD}$ such that the pull-down transistor 134 is constantly turned on (non-switchable).

A control signal is applied through a port 136 and a signal line 138 for controlling the potential on the line 128. The control signal is generated by an IDDQ test unit 140 which also measures the IDDQ current for testing in a conventional manner. The logical sense of the control signal generated by the unit 140 is logically high for IDDQ testing, and logically low or absent for normal circuit operation.

When the signal generated by the unit 140 is low, the buffer 132 produces a high signal on the line 128 to turn on the pull (pull-up and pull-down) transistors 122 and 124 for normal operation. When no signal is applied to the line 138 from the test unit 140, the pull-down transistor 134 pulls down the line 138 such that the buffer 132 similarly produces a high output. When the signal on the line 138 is high, the buffer 132 produces a low output which turns off the transistors 122 and 124 for IDDQ testing.

In order to provide effective IDDQ testing, it is desirable to additionally disconnect other circuit elements which can draw $V_{DD}$ current from the $V_{DD}$ source. These circuit elements include phase locked loop circuits, memory sense amplifiers, differential logic, etc. This can be accomplished using the same IDDQ test control signal on the line 128 which is used to turn off the pull transistors.

As illustrated, the integrated circuit 100 further comprises a phase locked loop (PLL) 142 and a memory circuit 144 which are connected between $V_{DD}$ and ground. NMOS transistors 146 and 148 are connected between $V_{DD}$ and the PLL 142 and memory 144 respectively.

The gates of the transistors 146 and 148 are connected to the line 128. When the test control signal on the line 128 is high for normal operation, the transistors 146 are turned on to connect the PLL and memory 144 to $V_{DD}$. When the signal on the line 128 is low for IDDQ testing, the transistors 146 and 148 are turned off to disconnect the PLL 142 and memory 144 from $V_{DD}$.

Figure 7:
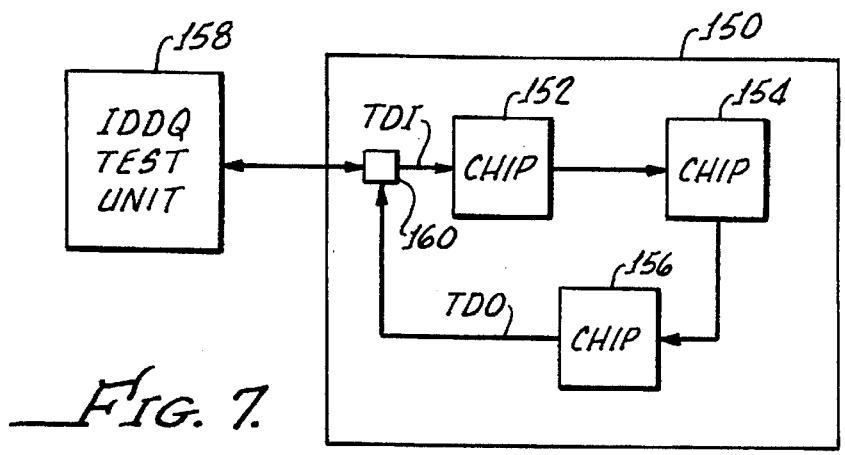
FIG. 7 is a diagram illustrating a board level application of the invention.

FIG. 7 illustrates how a boundary scan system can be provided to enable testing of one or more integrated circuit chips on a circuit board. The boundary scan system is known in the art per se, as set forth in the IEEE 1149.1 (JTAG) specification.

As shown in FIG. 7, an integrated circuit board 150 has a plurality of integrated circuit chips 152, 154 and 156 interconnectably mounted thereon. An IDDQ test unit 158 applies test and control signals to the board 150 through a test bus port 160.

For conventional internal testing using boundary scan, test input signals or vectors are applied serially and designated as TDI. The signals TDI are applied to the core logic of the chips 152, 154 and 156, and test output signals TDO are generated in response thereto. The output signals TDO are fed serially to the test unit 158 for analysis.

As will be described in detail below, each chip 152, 154 and 156 is provided with a chain of boundary scan cells which are connected between its pads or ports and the internal logic. These boundary scan cells are connected in a serial chain which enables signals to be serially input to and output from all of the ports in each chip. In addition, the boundary scan chains of the chips 152, 154 and 156 are connected in series and/or parallel such that all of the pads of all of the chips can be accessed using one input port TDI and one output port TDO.

Figure 8:
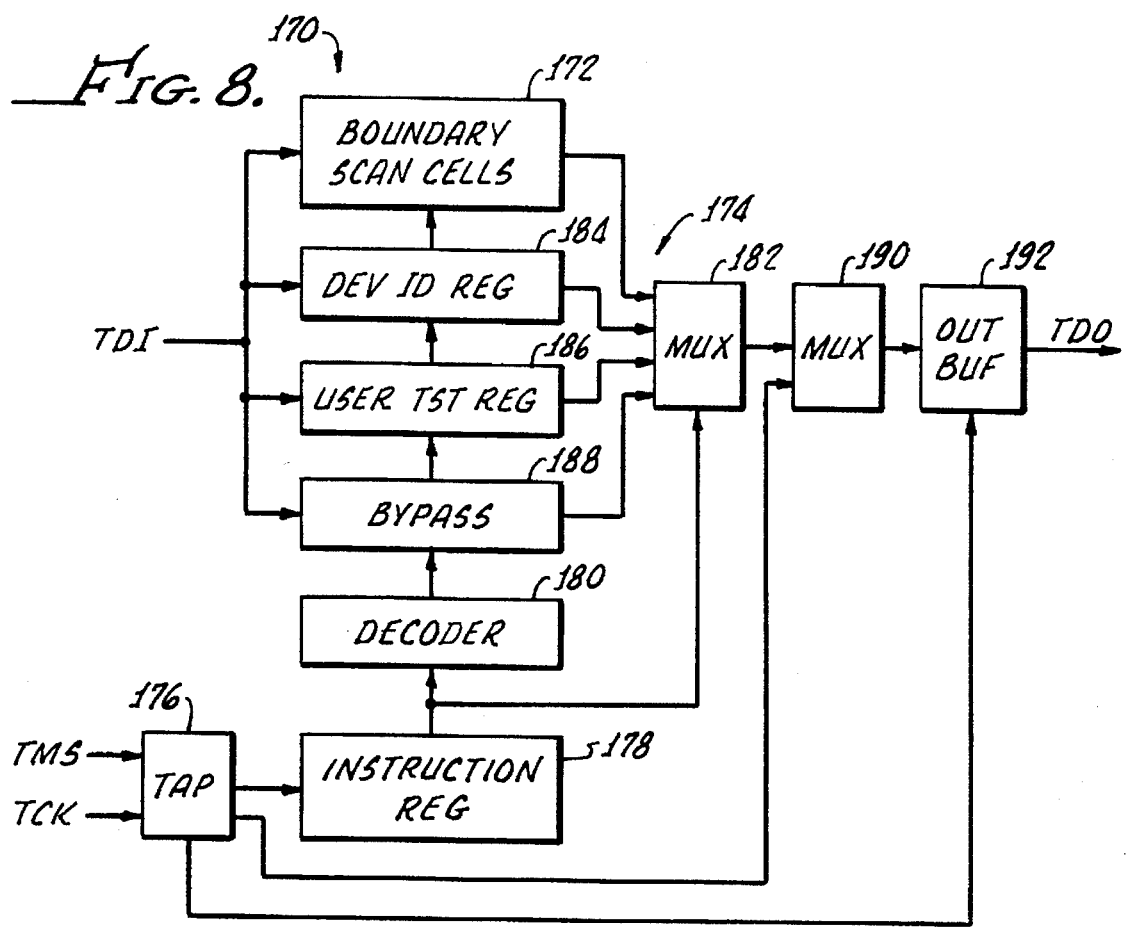
FIG. 8 is a block diagram illustrating a test access port controller of the circuit of FIG. 6.

A boundary scan system 170 which is provided on each chip is illustrated in FIG. 8. The system 170 includes a boundary scan cell chain 172 which comprises a chain of flip-flop cells and can be considered as a shift register. A test access port (TAP) controller 174 is provided to control signal access to the chain 172.

In addition to the serial input and output ports TDI and TDO which were described above, the test bus port 160 includes a test mode select (TMS) port and a test clock (TCK) port which are connected to a test access port 176.

The port TDI and the chain 172 are used to shift in any desired test vector for the chip. The output response of the chip logic can be shifted out using the chain 172 and the port TDO. This enables chip-level tests without the need to consider the board-level interconnections. Because the pads or ports of all of the chips on a board can be individually set or observed, the interconnections between chips can also be easily tested.

The ports TMS and TCK are used to select an operating mode and input instructions into an instruction register 178. The instructions are decoded by a decoder 180 and are also used to control a multiplexer 182 which selects data from the boundary scan cells 172, an optional device identification (ID) register 184, a user test register 186, or a bypass 188 which is used to prevent signals from being fed through chips which are not to be tested.

A multiplexer 190 is provided to select the output of the multiplexer 182 or the test access port 176 for application to an output buffer 192. The output of the test access port 176 is also applied to the buffer 192.

In the conventional boundary scan system, the ports TMS and TCK are used to select one of four operating modes:

(1) Normal operation
(2) Boundary scan test.
(3) Internal scan test.
(4) Internal built-in self test (BIST).

In accordance with the present invention, an additional mode is added:

(5) IDDQ test.

This can be done without modification of the boundary scan test system, because the TAP controller 174 is a programmable finite state machine. For example, the port TMS can be used to select normal operating mode (1); or test mode which can be (2) through (5).

When test mode is selected, the ports TMS and TCK in combination can be used to select the desired one of modes (2) to (5).

Figure 9:
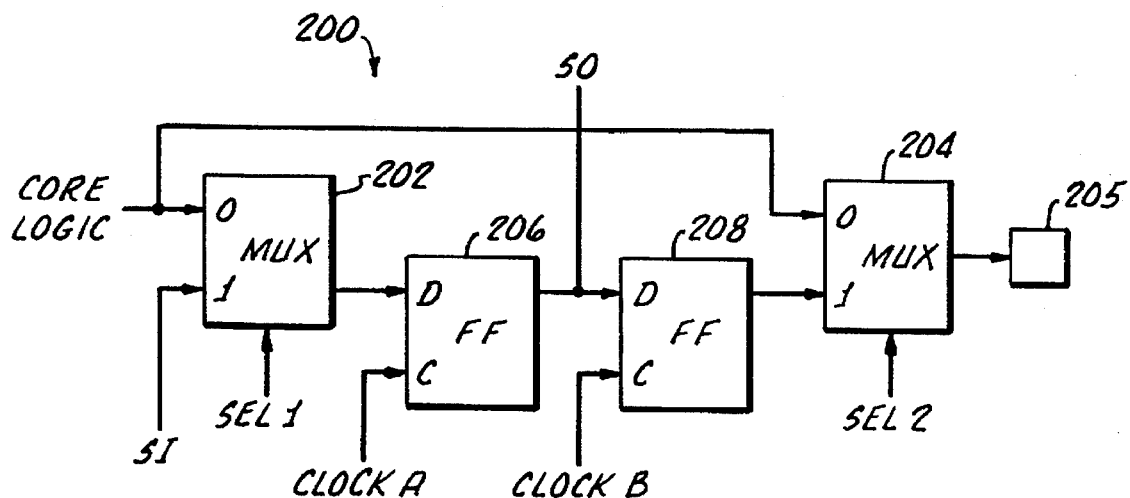
FIG. 9 is a schematic diagram illustrating a boundary scan cell used for signal output.

The individual cells in the chain 172 can be used for input or output. FIG. 9 illustrates a cell 200 as being used for output. The cell 200 comprises a multiplexer 202 having a 0 input connected to an output buffer (not shown) for the core logic, and a 1 input for receiving a shift input SI from an upstream cell in the chain 172.

The core logic output is also connected to the 0 input of a multiplexer 204, the output of which is connected to a pad or port 205. The output of the multiplexer 202 is connected to the D input of a D-type flip-flop 206, the output of which is connected to the D input of a D-type flip-flop 208. The output of the flip-flop 208 is connected to a 1 input of the multiplexer 204.

The flip-flops 206 and 208 are connected in a master-slave arrangement and clocked on alternating clock cycles CLOCK A and CLOCK B to prevent runaway when signals are shifted through the boundary cell chain 172.

To output a signal from the core logic for normal operation, a select signal SEL2 is made high to connect the 0 input of the multiplexer 204 to the port 205.

A signal is clocked into the flip-flops 206 and 208 and thereby into the boundary cell chain by making the select signal SEL1 high to select the 0 output of the multiplexer 202. Application of the clock signals CLOCK A and CLOCK B causes the signal from the core logic to be clocked into the flip-flops 206 and 208.

To shift a signal out to the next downstream cell in the chain and shift a signal in from the next upstream cell in the chain, the select signal SEL1 is made low to select the 1 input of the multiplexer 202. Application of the clock signals CLOCK A and CLOCK B causes the signal at SI to be shifted into the flip-flops 206 and 208 from the previous cell and causes the signal at SO to be shifted out of the flip-flops 206 and 208 to the next cell.

The signal in the flip-flops 206 and 208 is optionally available at the port 205 by making the select signal SEL2 low to select the 1 input of the multiplexer 204.

Figure 10:
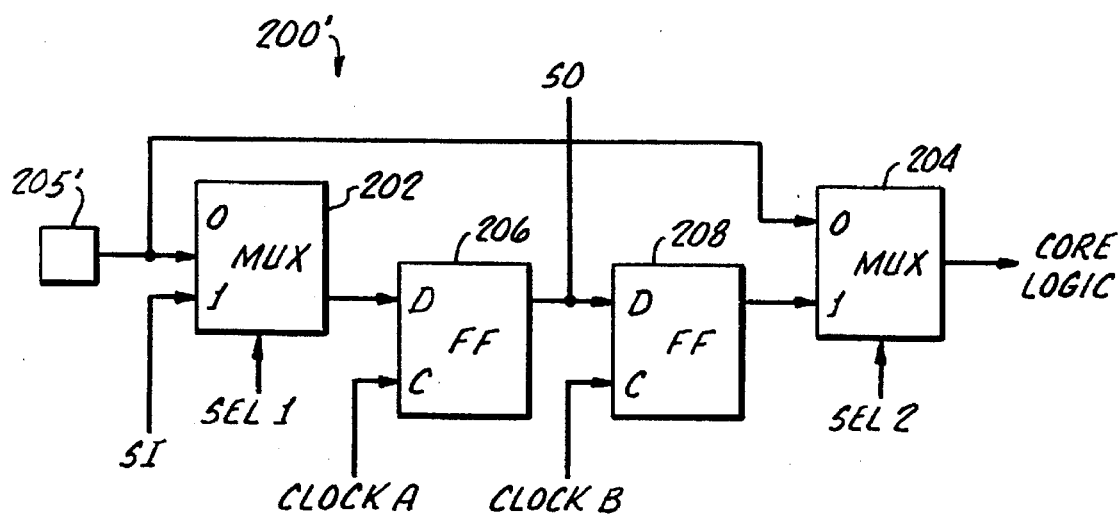
FIG. 10 is similar to FIG. 9, but illustrates a boundary scan cell used for signal input.

FIG. 10 illustrates a cell 200' which is the same as the cell 200, except that it is used as an input. In this case, a pad or port 205' is connected to the 0 input of the multiplexer 202, and the output of the multiplexer 204 is connected to an input buffer (not shown) for the core logic.

A signal is input to the core logic for normal operation by selecting the 0 input of the multiplexer 204. The signal can optionally be input to the cell chain by selecting the 0 input of the multiplexer 202.

To shift a signal out to the next downstream cell in the chain and shift a signal in from the next upstream cell in the chain, the select signal SEL1 is made low to select the 1 input of the multiplexer 202. Application of the clock signals CLOCK A and CLOCK B causes the signal at SI to be shifted into the flip-flops 206 and 208 from the previous cell and causes the signal at SO to be shifted out of the flip-flops 206 and 208 to the next cell.

Figure 11:
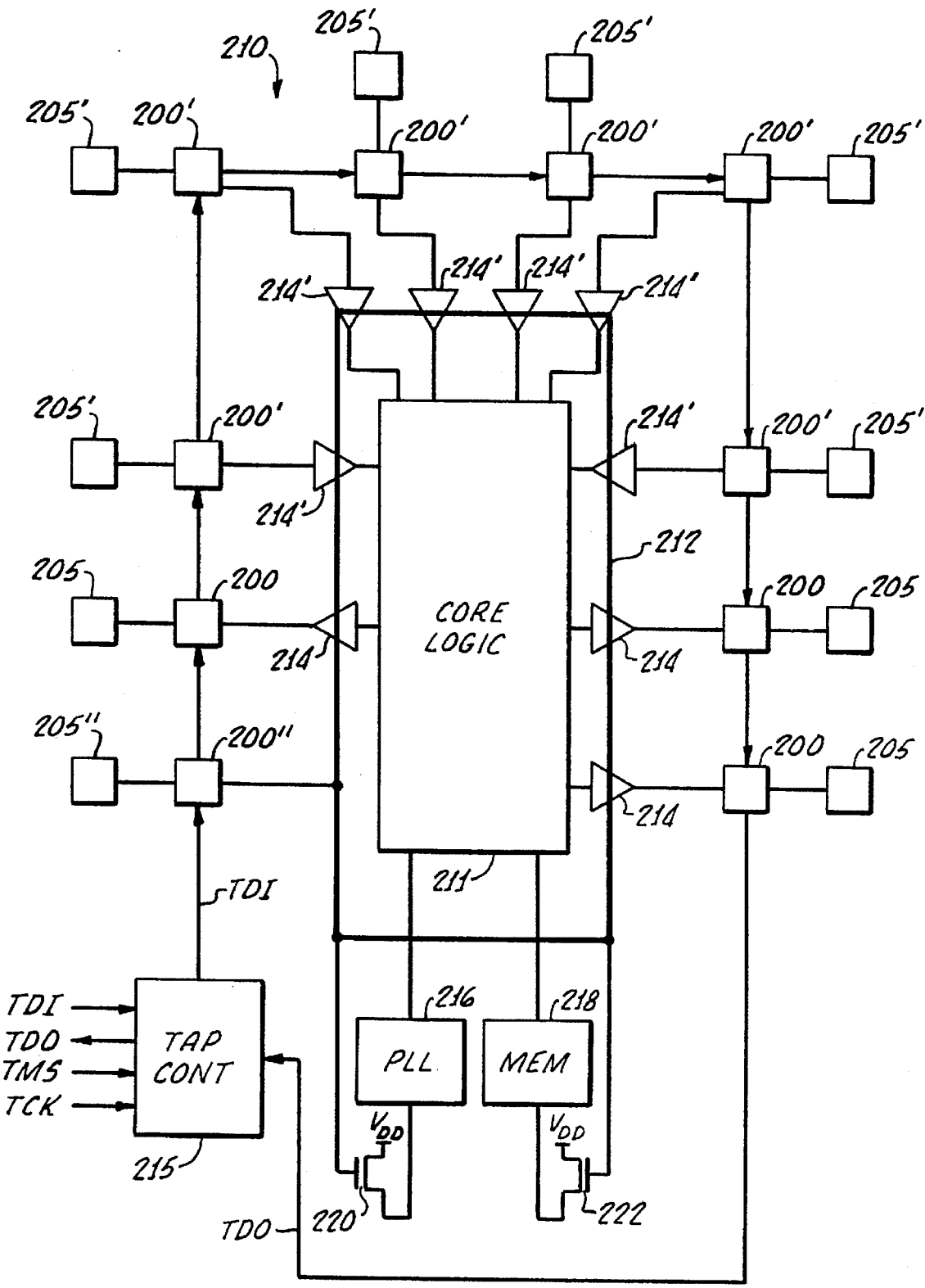
FIG. 11 is a schematic diagram illustrating an integrated circuit of the invention including a boundary scan test system in which an IDDQ test control signal is generated by a boundary scan cell.

FIG. 11 illustrates an integrated circuit 210 in which one of the boundary scan cells is used to apply the IDDQ test control signal to the IDDQ test signal line which is designated as 212. The line 212 forms a continuous ring between pads 205 and 205' and a core logic 211 as described above with reference to FIG. 6.

In FIG. 11, output buffers 214 and input buffers 214' are connected to the boundary scan cells 200 and 200' as illustrated in FIGS. 9 and 10. The cells 200 and 200' are controlled by a test access port controller 215.

The buffers 214 and 214', although not explicitly illustrated in detail, include buffers having pull-up and/or pull-down circuits connected to their signal lines which connect them to the pads 205 and 205'. The IDDQ signal line 212 is connected to the gates of the pull-up and pull-down transistors of the buffers 214 and 214' as described above with reference to FIG. 6.

One of the boundary scan cells, designated as 200", is used as an input as described with reference to FIG. 10. The output of the multiplexer 204 of the cell 200", however, is not connected to the core logic 111, but is connected to drive the IDDQ test signal line 212.

For conventional internal testing using boundary scan, test vector signals are serially shifted into the boundary scan cell chain through the input TDI and applied to the core logic 211 as described above. It will be noted that the signals in the cells 200 which are used for output are not meaningful for input.

Then, the core logic 211 generates output signals in response to the input signals, which are applied to the boundary scan cell chain and shifted out through the output port TDO. The signals in the cells 200' which are used for input are not meaningful for output.

For IDDQ testing, at least one signal is input through the input port TDI and shifted into the cell 200". This signal is logically low, and is applied to the IDDQ test signal line 212 to turn off the pull-ups and pull-downs in the buffers 214 and 214'. A logically high signal is applied to the cell 200" and thereby the line 212 during internal test operation and normal operation to turn on the pull-ups and pull-downs.

Further illustrated in FIG. 11 are a phase locked loop 216, a memory 218, and transistors 220 and 222 which are used to disconnect the elements 216 and 218 from $V_{DD}$ as described above with reference to FIG. 6.

Figure 12:
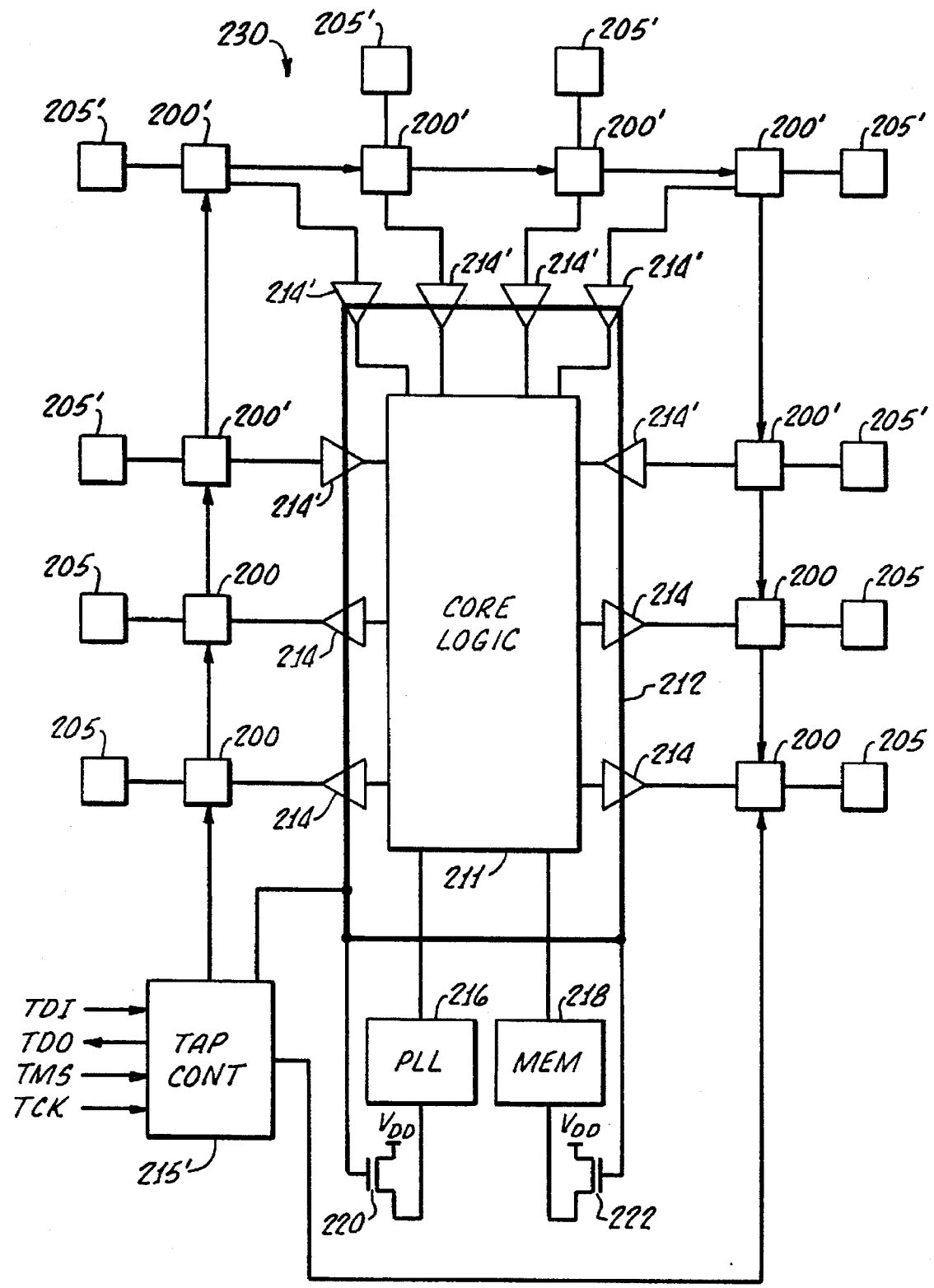
FIG. 12 is similar to FIG. 11 but illustrates the IDDQ test control signal as being generated by a test access port controller.

FIG. 12 illustrates an integrated circuit 230 which is similar to the circuit 210 of FIG. 11 except that a test access port controller 215' is adapted to generate the IDDQ test control signal which is applied to the line 212.

As described above, the test access port controller 215' can be controlled without modification to provide an fifth mode of operation (IDDQ test). As the controller 215' is a finite state machine, minimal hardware modification is required to enable it to produce an additional control output for IDDQ testing.

The embodiments of FIGS. 11 and 12 are especially advantageous in that they enable pull-ups and pull-downs to be disabled for IDDQ testing using a boundary scan system which is conventionally provided in integrated circuits for internal functional testing. Minimal modification of the existing hardware is required to provide this function, and the IDDQ signal circuitry can be made transparent to designers during simulation.

Although the foregoing detailed description of the preferred embodiments of the present invention has been primarily directed to the use of switchable pull-ups in IDDQ testing of integrated circuit signal paths, this is by way of example and not limitation. As previously discussed, switchable pull-ups could provide advantages in other applications, such as reducing standby current in integrated circuits by controllably disconnecting pull-ups in unused portions of the circuit. The switchable pull-ups could also provide a more flexible interface between an integrated circuit and external devices, in that the pull-ups could be connected or disconnected as necessary to interface with a particular external device. Many other alternative implementations and embodiments will be apparent to those skilled in the art. The scope of the present invention is therefore limited only by the appended claims.

We claim:

1. A switchable pull-up circuit for a signal line of an integrated circuit, comprising:
    switching means connected between said signal line and a source of potential of said integrated circuit; and
    IDDQ testing means for applying a control signal to said switching means having a first selectable value that enables said switching means to pull said signal line to said source of potential, and a second selectable value that causes said switching means to disconnect said signal line from said source of potential for IDDQ testing of said integrated circuit.

2. The switchable pull-up circuit of claim 1 wherein said source of potential comprises a Vdd voltage circuit source of said integrated circuit.

3. The switchable pull-up circuit of claim 1 wherein said switching means is a FET.

4. The switchable pull-up circuit of claim 3 wherein said FET is a p-channel FET.

5. The switchable pull-up circuit of claim 3 wherein said control signal is connected to an input gate of said FET.

6. A method of controlling switching means connected between a signal line and a source of potential of an integrated circuit, comprising the steps of:
    applying a control signal to said switching means having a first selectable value that enable said switching means to pull said signal line to said source of potential; and
    applying said control signal to said switching means having a second selectable value that causes said switching means to disconnect said signal line from said source of potential for IDDQ testing of said integrated circuit.

7. The method of claim 6 wherein the second method step of applying said control signal includes:
    providing a boundary scan test system; and
    causing said boundary scan test system to apply said control signal to said switching means.

8. The method of claim 6 further including the step of applying another control signal to said switching means to effectively connect said signal line to said source of potential of said integrated circuit through said switching means during normal operation of said integrated circuit.

9. The method of claim 6 wherein said source of potential comprises a Vdd voltage source of said integrated circuit.

10. The method of claim 6 wherein said switching means is a FET.

11. The method of claim 10 wherein said FET is a p-channel FET.

12. The method of claim 10 wherein said control signal input is connected to a gate of said FET.

13. An integrated circuit comprising:
    a source of potential;
    a plurality of signal lines;
    a plurality of switching means connected between said source of potential and said signal lines respectively; and
    IDDQ testing means for applying a control signal to said plurality of switching means having a first selectable value that enables said plurality of switching means to pull said signal lines to said source of potential respectively, and a second selectable value that causes said plurality of switching means to disconnect said signal lines from said source of potential respectively for IDDQ testing of said integrated circuit.

14. The integrated circuit of claim 13 wherein said IDDQ testing means comprises:
    a boundary scan test system; and
    means for causing said boundary scan test system to apply said control signal to said plurality of switching means.

15. The integrated circuit of claim 13 wherein said control signal is operative to configure each of said plurality of switching means to effectively connect each of said signal lines to said source of potential of said integrated circuit through said plurality of switching means during normal operation of said integrated circuit.

16. The integrated circuit of claim 13 wherein said source of potential is a Vdd voltage source of said integrated circuit.

17. The integrated circuit of claim 13 wherein each of said plurality of switching means is a FET.

18. The integrated circuit of claim 17 wherein said control signal is connected to a gate of each one of said FET.

19. A method of testing an integrated circuit, said method comprising the steps of:

providing a switchable pull-up circuit including switching means connected between a signal line and a source of potential of said integrated circuit and responsive to a control signal;

transmitting said control signal to said switching means so as to effectively disconnect said signal line from said source of potential; and testing said integrated circuit;

wherein faults masked by said pull-up circuit can be detected during said testing.

20. The method of claim 19 wherein said testing of said integrated circuit includes providing test signals on signal lines of said integrated circuit.

21. The method of claim 19 wherein said testing of said integrated circuit includes a measurement of a quiescent supply current of said integrated circuit.

22. A switchable pull-up/pull-down circuit for a signal line of an integrated circuit, comprising:

a pull-up transistor for connecting the signal line to a first electrical source of potential;

a pull-down transistor for connecting the signal line to a second electrical source of potential which is lower than the first electrical source of potential; and IDDQ testing means for applying an IDDQ testing control signal to the pull-up transistor and to the pull-down transistor having a first selectable value that enable the pull-up transistor to pull the signal line to the first electrical source of potential and enables the pull-down transistor to pull the signal line to the second electrical source of potential, and a second selectable value that causes the pull-up transistor and the pull-down transistor to disconnect the signal line from the first electrical source of potential and from the second electrical source of potential for IDDQ testing of the integrated circuit.

23. The switchable pull-up/pull-down circuit of claim 22 wherein the first electrical source of potential comprises a Vdd voltage circuit source of the integrated circuit.

24. The switchable pull-up/pull-down circuit of claim 22 wherein the pull-up transistor comprises a first FET, and the pull-down transistor comprises a second FET.

25. The switchable pull-up/pull-down circuit of claim 24, in which the IDDQ testing means is connected to apply the testing control signal to gates of the first FET and the second FET.

26. The switchable pull-up/pull-down circuit of claim 24 wherein the IDDQ testing means comprises an invertor connected between the IDDQ testing means and one of the first FET and the second FET.

27. The switchable pull-up/pull-down circuit of claim 24 wherein the first FET is a p-channel FET and the second FET is an n-channel FET.

28. The switchable pull-up/pull-down circuit of claim 27 wherein the IDDQ testing means comprises an invertor connected between the IDDQ testing means and one of the first FET and the second FET.

29. The switchable pull-up/pull-down circuit of claim 28 wherein the invertor is connected between the IDDQ testing means and the second FET, the first selectable value is logic low, and the second selectable value is logic high.

30. The switchable pull-up/pull-down circuit of claim 28 wherein the invertor is connected between the IDDQ testing means and the first FET, the first selectable value is logic high, and the second selectable value is logic low.

31. The method of performing IDDQ testing of an integrated circuit having a signal line, a pull-up transistor for connected the signal line to a first electrical source of potential, and a pull-down transistor for connecting the signal line to a second electrical source of potential which is lower than the first electrical source of potential, comprising the steps of:

applying an IDDQ testing control signal to the pull-up transistor and to the pull-down transistor having a first selectable value that enables the pull-up transistor to pull the signal line to the first electrical source of potential and enables the pull-down transistor to pull the signal line to the second electrical source of potential; and applying the IDDQ testing control signal to the pull-up transistor and to the pull-down transistor having a second selectable value that causes the pull-up transistor and the pull-down transistor to disconnect the signal line from the firs electrical source of potential and from the second source of electrical potential for IDDQ testing of the integrated circuit.

32. A switchable pull circuit for a signal line of an integrated circuit, comprising:

a pull transistor connected between the signal line and a source of potential of the integrated circuit; and IDDQ testing means for applying an IDDQ testing control signal to said pull transistor having a first selectable value that enables said pull transistor to pull said signal line to said source of potential, and a second selectable value that causes said pull transistor to disconnect said signal line from said source of potential for IDDQ testing of said integrated circuit.

33. The switchable pull circuit of claim 32, in which the pull transistor is a pull-down transistor.

* * * * *